United States Patent
Bae et al.

(10) Patent No.: US 7,963,816 B2
(45) Date of Patent: Jun. 21, 2011

(54) ORGANIC ELECTRO LUMINESCENCE DEVICE AND FABRICATION METHOD THEREOF

(75) Inventors: Sung Joon Bae, Seongnam-si (KR); Jae Yoon Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 18 days.

(21) Appl. No.: 12/654,764

(22) Filed: Dec. 31, 2009

(65) Prior Publication Data

US 2010/0167435 A1 Jul. 1, 2010

Related U.S. Application Data

(62) Division of application No. 10/964,691, filed on Oct. 15, 2004, now Pat. No. 7,652,422.

(30) Foreign Application Priority Data

Mar. 24, 2004 (KR) .................. 10-2004-0019937

(51) Int. Cl.
*H01J 9/00* (2006.01)
(52) U.S. Cl. .......................... 445/23; 445/25
(58) Field of Classification Search ............... 445/23–25
See application file for complete search history.

(56) References Cited

U.S. PATENT DOCUMENTS

| 7,049,636 | B2 | 5/2006 | Weaver et al. |
| 2003/0146711 | A1 | 8/2003 | Tsujimura et al. |
| 2004/0079945 | A1 | 4/2004 | Weaver et al. |
| 2004/0080476 | A1 | 4/2004 | Tsai et al. |
| 2004/0108810 | A1 | 6/2004 | Tsujimura et al. |
| 2004/0119398 | A1 | 6/2004 | Koo et al. |
| 2004/0135148 | A1 | 7/2004 | Lin |

FOREIGN PATENT DOCUMENTS

| EP | 1 122 800 A2 | 8/2001 |
| JP | 2001-035662 | 2/2001 |

*Primary Examiner* — Joseph L Williams
(74) *Attorney, Agent, or Firm* — McKenna Long & Aldridge LLP

(57) ABSTRACT

Provided is a method of fabricating an organic electro luminescence device, the method comprising: forming a thin film transistor on a substrate; forming a passivation layer and a first electrode on the substrate including the thin film transistor; forming a contact hole exposing an upper surface of a drain electrode of the thin film transistor at a predetermined portion of the first electrode and the passivation layer; forming a buffer layer and a barrier rib on a predetermined portion of an upper surface of the first electrode; forming an organic emission layer within a region defined by the buffer layer; and forming a second electrode on the organic emission layer such that the second electrode is electrically connected with the drain electrode through the contact hole.

36 Claims, 10 Drawing Sheets

ORGANIC ELECTRO LUMINESCENCE DEVICE AND FABRICATION METHOD THEREOF This application is a divisional application of application Ser. No. 10/964,691, filed Oct. 15, 2004 now U.S. Pat. No. 7,652,422 and claims the benefit of Korean Patent Application No. 2004-19937, filed on Mar. 24, 2004, which is hereby incorporated by reference for all purposes as if fully set forth herein.

BACKGROUND OF THE INVENTION

1. Field of the Invention

The present invention relates to an organic electro luminescence device and fabrication method thereof, and more particularly, to an organic electro luminescence device in which an amorphous silicon thin film transistor is employed as a driving element and a fabrication method thereof.

2. Discussion of the Related Art

A liquid crystal display device (LCD) having advantages of lightweight, slim profile and low power consumption has been the highlight of flat panel displays attracting public attention.

However, since the LCD is a passive device, not a light emitting device (i.e., active device), it has technical limitations in brightness, contrast, viewing angle, large-sized screen and the like. To this end, new flat panel displays capable of overcoming the disadvantages of the LCD are being actively researched.

Among such flat panel displays, an organic electro luminescence device (ELD) is a self-emission type display that has a high contrast and a wider viewing angle. The organic ELD can be made having lightweight and slim profile compared with other displays because it does not require a backlight. It also can decrease power consumption compared to other displays.

Further, the organic ELD can be driven with a low DC voltage at a rapid response rate. Since all of the components of the organic ELD are formed of solid materials, it is durable against external impact. It can be also used in a wide temperature range and be manufacture with low cost.

In particular, since the organic ELD is manufactured through only a deposition process and an encapsulation process, the manufacturing process and apparatus are very simple, which is unlike the method for fabricating an LCD or a plasma display panel (PDP).

Also, in driving the ELD in the active matrix way that each pixel has a thin film transistor functioning as a switching element, even when a low current is applied, uniform luminescence can be obtained. As a result, the organic ELD has advantages of low power consumption, high definition and large-sized screen.

Such an active matrix type organic electro luminescence device (hereinafter referred to as 'AMOLED') will be described hereinafter with reference to the accompanying drawing.

FIG. 1 shows a circuit diagram illustrating a basic pixel structure of a related art AMOLED.

As illustrated in the drawing, gate lines GL 2 are formed in a first direction and data and power lines DL 3 and VDD 4 are formed in a second direction intersecting the first direction to define a unit pixel region.

A switching TFT 5 that is an addressing element is formed on each crossing point of the gate and data lines 2 and 3. A storage capacitor $C_S$ 6 is connected with the switching TFT 5 and the power line 4. A drive TFT 7 that is a current source element is connected with the storage capacitor $C_S$ 6 and the power line 4. An organic electro luminescence diode 8 is also connected with the drive TFT 7.

When current is applied to the organic light emitting material in a forward direction, electrons and holes are recombined, moving through a P-N junction between an anode electrode as a hole donor and a cathode electrode as an electron donor. Therefore, the energy of the organic electro luminescence diode 8 becomes lower than that created when the electrons are separated from the holes. At this point, energy difference is generated, thereby emitting light.

In other words, the unit pixel of the AMOLED essentially includes the switching TFT 5 for addressing a pixel voltage that is a gate driving voltage, a drive TFT 7 for controlling a drive current of the AMOLED, and a storage capacitor 6 for stably maintaining a pixel voltage.

The organic electro luminescence device can be classified into a top emission type and a bottom emission type according to an advancing direction of the light emitted from the organic electro luminescence diode.

The TFT used in the AMOLED can be classified into an amorphous silicon (a-Si) TFT and a polycrystalline silicon (p-Si) TFT according to states of a thin semiconductor film functioning as an active channel.

Recently, research to employ the p-Si TFT having a high field effect mobility in the AMOLED has been actively performed, but it is more typical to employ the a-Si TFT in the AMOLED.

FIG. 1 illustrates the AMOLED employing the a-Si TFTs. The a-Si TFTs are an n-type a-Si TFT. Accordingly, as illustrated in FIG. 1, the AMOLED is connected to the source electrode (S) of the drive TFT 7, and the power line 4 is connected to the drain electrode D of the drive TFT 7.

FIG. 2 is a schematic sectional view illustrating a related art bottom emission type AMOLED.

As illustrated in the drawing, the bottom emission type AMOLED includes a first transparent substrate 12, an array part 14 formed on the first transparent substrate 12, and an anode 16, an organic emission layer 18 and a cathode sequentially formed on the array part 14 and forming an organic electro luminescence diode.

At this point, the organic emission layer 18 represents red R, green G and blue B colors. For example, organic material emitting R, G and B colors are patterned on each pixel P. Alternatively, the organic emission layer 18 may be made in a multi-layer structure formed of organic material.

In other words, the organic electro luminescence layer 18 can be formed between the anode and the cathode by sequentially depositing a hole injection layer (HIL), a hole transporting layer (HTL), an emission layer (EML), and an electron transporting layer (ETL).

The first substrate 12 is attached with the second substrate 28, on which an absorbent 22 is formed, by a sealant 26, thereby completing the organic electro luminescence device that is encapsulated.

The absorbent 22 is for removing moisture and oxygen that may infiltrate into the encapsulated organic electro luminescence device. A portion of the substrate 28 is etched, and the absorbent 22 is filled in the etched portion and fixed by a tape.

FIG. 3 is a sectional view partially illustrating a TFT array part of the related art AMOLED depicted in FIGS. 1 and 2. Specifically, FIG. 3 illustrates a section of a region including a drive TFT of the TFT array part.

Generally, in an AMOLED, each of the pixels of the TFT array formed on the substrate is provided with a switching element, a drive element and a storage capacitor. Depending on the operational characteristics, the switching element or drive element can be formed of a combination of more than one TFT.

Each of the switching TFT T and the drive TFT $T_D$ includes a gate electrode, an active layer, a source electrode and a drain electrode. At this time, the TFTs used in the AMOLED can be classified into a-Si TFTs and p-Si TFTs according to states of a thin semiconductor film functioning as an active channel.

FIG. 3 illustrates the AMOLED employing the a-Si TFTs. At this time, the a-Si TFTs are n-type a-Si TFTs as aforementioned. Accordingly, the anode of the AMOLED is connected to the source electrode (S) of the drive TFT.

Referring to FIG. 3, the drive TFT $T_D$ includes a gate electrode 30, a gate insulating layer 31, a source electrode 33, and a drain electrode 34. An active layer 32 is disposed between the source electrode 33 and the drain electrode 34.

Also, a pixel region is configured to include an anode 36 connected with the source electrode 33, an organic emission layer 38 formed on the anode 36 in a single layer structure or a multi-layer structure, and a cathode 39 formed on the organic emission layer 38, for injecting electrons. The anode 36 injects holes into the organic emission layer 38.

The organic emission layer 38 having a multi-layer structure can be configured to include the HIL, HTL, EML and ETL, as aforementioned.

The pixel regions are arranged in a matrix configuration and are separated from one another by a buffer 37.

In other words, the related art AMOLED is configured to include the drive TFT $T_D$ formed on the pixel region; the anode 36 connected with the source electrode 33 and functioning as a pixel electrode; the buffer 37 formed on the anode 36 for partitioning the pixel regions from one another; the organic emission layer 38 comprised of the HIL, the HTL, the EML and the ETL within the buffer 37; and the cathode 39 formed on the organic emission layer 38.

From the drawings of FIGS. 1 through 3, it is well known that the related art AMOLED employing the a-Si TFT as a drive TFT is configured to include the anode 36 connected with the source electrode 33 of the drive TFT $T_D$, and the organic emission layer 38 and the cathode 39 disposed on the anode 36.

In other words, according to the construction of the related AMOLED, the anode 36 connected with the source electrode 33 of the drive TFT $T_D$ functions as a pixel electrode, and the cathode 39 functions as a counterpart electrode, i.e., a common electrode, which is contrary to the general structure where the cathode functions as the pixel electrode and the anode functions as the common electrode.

Hence, when the pixels of the AMOLED are configured in the above construction, the circuit is not stable so that a driving failure may be caused.

SUMMARY OF THE INVENTION

Accordingly, the present invention is directed to an organic electro luminescence device and fabrication method thereof that substantially obviates one or more problems due to limitations and disadvantages of the related art.

An advantage of the present invention is to provide an organic electro luminescence device and fabrication method thereof in which a drive TFT of each pixel is formed of a-Si, a second electrode (i.e., cathode) of an organic electro luminescence diode is connected with a drain electrode of the drive TFT, and the organic electro luminescence diode has a stack structure that is the same as that of the conventional EL, thereby stabling and easily driving the organic electro luminescence device.

Additional advantages and features of the invention will be set forth in part in the description which follows and in part will become apparent to those having ordinary skill in the art upon examination of the following or may be learned from practice of the invention. These and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an organic electro luminescence device including a plurality of TFTs on a substrate; a passivation layer and a first electrode on the substrate including the TFTs; a contact hole through a predetermined portion of the first electrode and the passivation layer exposing an upper surface of a drain electrode of the thin film transistor; a buffer layer on a predetermined portion of an upper surface and an edge of the first electrode; an organic emission layer within a region defined by the buffer layer; and a second electrode on the organic emission layer and electrically connected with the drain electrode through the contact hole.

In another aspect of the present invention, there is provided a method of fabricating an organic electro luminescence device, the method comprising forming a thin film transistor on a substrate; forming a passivation layer on the substrate including the thin film transistor; forming a first electrode layer on the passivation layer; forming a contact hole through the passivation layer and the first electrode layer exposing an upper surface of a drain electrode of the thin film transistor at a predetermined portion of the first electrode and the passivation layer; forming a buffer layer on a predetermined portion of an upper surface of the first electrode; forming an organic emission layer within a region defined by the buffer layer; and forming a second electrode on the organic emission layer such that the second electrode is electrically connected with the drain electrode through the contact hole.

In another aspect of the present invention, there is provided a method of fabricating an organic electro luminescence device, the method comprising forming a thin film transistor on a substrate; forming a passivation layer on the substrate including the thin film transistor; patterning the passivation layer to form a contact hole; forming a first electrode layer on the passivation layer; patterning the first electrode layer to form a contact hole corresponding to the contact hole through the passivation layer and exposing an upper surface of a drain electrode of the thin film transistor at a predetermined portion of the first electrode and the passivation layer; forming a buffer layer on a predetermined portion of an upper surface of the first electrode; forming an organic emission layer within a region defined by the buffer layer; and forming a second electrode on the organic emission layer such that the second electrode is electrically connected with the drain electrode through the contact hole.

In another aspect of the present invention, there is provided a method of fabricating an organic electro luminescence device, the method comprising forming a thin film transistor on a substrate; forming a passivation layer on the substrate including the thin film transistor; forming a first electrode layer on the passivation layer; patterning the first electrode layer to form a contact hole; patterning the passivation layer to form a contact hole corresponding to the contact hole through the first electrode layer and exposing an upper surface of a drain electrode of the thin film transistor at a predetermined portion of the first electrode and the passivation layer; forming a buffer layer on a predetermined portion of an upper surface of the first electrode; forming an organic emission layer within a region defined by the buffer layer; and forming a second electrode on the organic emission layer such that the second electrode is electrically connected with the drain electrode through the contact hole.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

In the drawings.

DETAILED DESCRIPTION OF THE ILLUSTRATED EMBODIMENTS

Reference will now be made in detail to embodiments of the present invention, examples of which are illustrated in the accompanying drawings.

Figure 4:
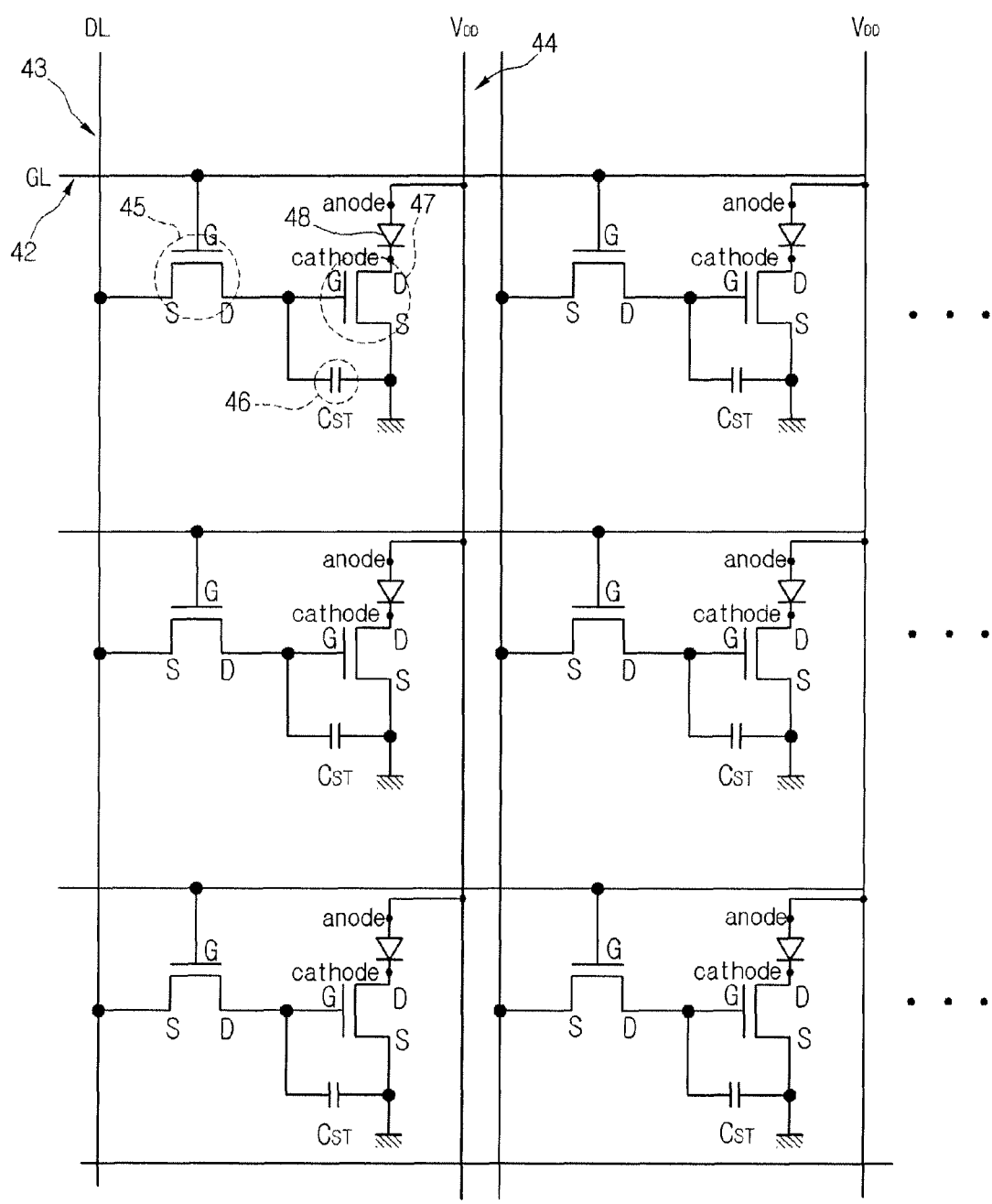
FIG. 4 is a circuit diagram of a basic pixel structure of an AMOLED according to the present invention.

FIG. 4 is a circuit diagram illustrating a basic pixel structure of an AMOLED according to the present invention.

Referring to FIG. 4, gate lines (GL) 42 are formed in a first direction, and data lines (DL) 43 and power lines (VDD) 44 are formed spaced apart from each other by a predetermined distance and in a second direction intersecting the first direction. Pixel regions are defined by the gate lines 42, the data lines 43 and the power lines 44.

A switching TFT 45, which acts as an addressing element, is formed at each crossing point of the gate and data lines 42 and 43. A storage capacitor $C_S$ 46 is connected to the switching TFT 45 and the power line 44.

A drive TFT 7 which acts as a current source element, is connected to the storage capacitor $C_S$ 46 and the power line 44. An organic electro luminescence diode 48 is connected to the drive TFT 7.

When current is applied to the organic light emitting material in a forward direction, electrons and holes are recombined, moving through a P-N junction between an anode electrode as a hole donor and a cathode electrode as an electron donor. Therefore, the energy of the organic electro luminescence diode 48 becomes lower than that created when the electrons are separated from the holes. At this point, energy difference is generated, thereby emitting light.

That is, a basic pixel structure of the AMOLED includes the switching TFT 45 for addressing a gate drive voltage (i.e., a pixel voltage), the drive TFT 47 for controlling a drive current of the AMOLED, and the storage capacitor for stably maintaining the pixel voltage.

Unlike the structure of the related art AMOLED, a drain electrode D of the drive TFT 47 is connected to a second electrode (i.e., a cathode) of the organic electro luminescence diode 48, and a source electrode S of the drive TFT 47 is connected to the power line 44.

At this point, the TFT for driving each pixel is provided with an n-type a-Si TFT having an active layer formed of amorphous silicon.

The organic electro luminescence device can be driven stably by configuring the drive TFT with an amorphous TFT and connecting the drain electrode D of the drive TFT 47 to the second electrode (cathode) of the organic electro luminescence diode.

That is, the second electrode (cathode) of the organic electro luminescence diode is connected to the drain electrode D of the drive TFT 47 and configured to act as the pixel electrode, and the first electrode (anode) of the organic electro luminescence diode is configured to act as a common electrode. Through this configuration, the AMOLED can be driven stably.

When the TFTs for driving each pixel are configured with the amorphous TFTs, a width-to-length ratio (W/L ratio) of the drive TFT must be large so as to drive the organic light emitting layer, because mobility of the amorphous silicon is lower than a crystalline silicon by about 0.5-1 cm2/Vsec.

The size of the drive TFT must be large because of the large W/L ratio of the drive TFT. However, if the size of the drive TFT becomes too large, there is a problem in that an aperture ratio of a bottom emission type organic electro luminescence device is reduced.

Therefore, it may be preferable that the organic electro luminescence device using the amorphous TFTs operates in a top emission mode instead of the bottom emission mode.

Figure 5:
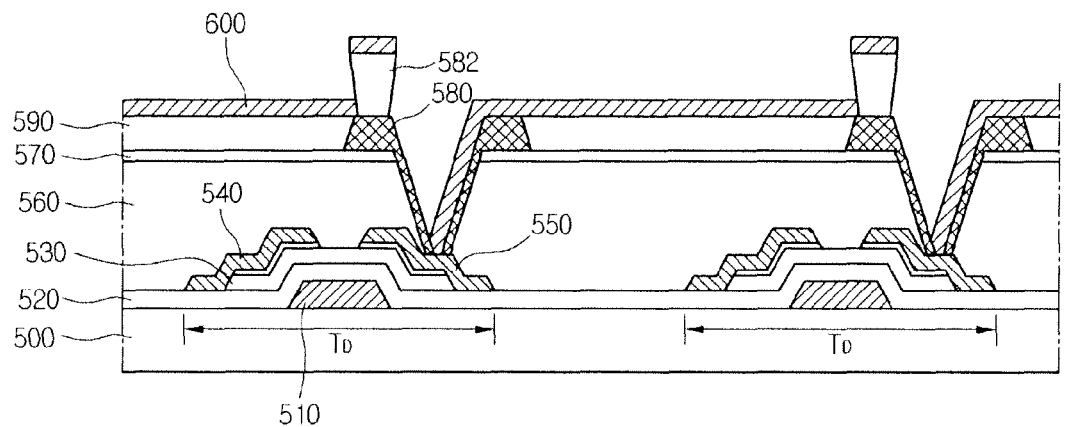
FIG. 5 is a sectional view of a portion including a TFT array part of an AMOLED according to the present invention.

FIG. 5 is a sectional view of a portion including a TFT array part of the AMOLED according to the present invention. In FIG. 5, a portion including the drive TFT of the TFT array part is illustrated.

Figure 1:
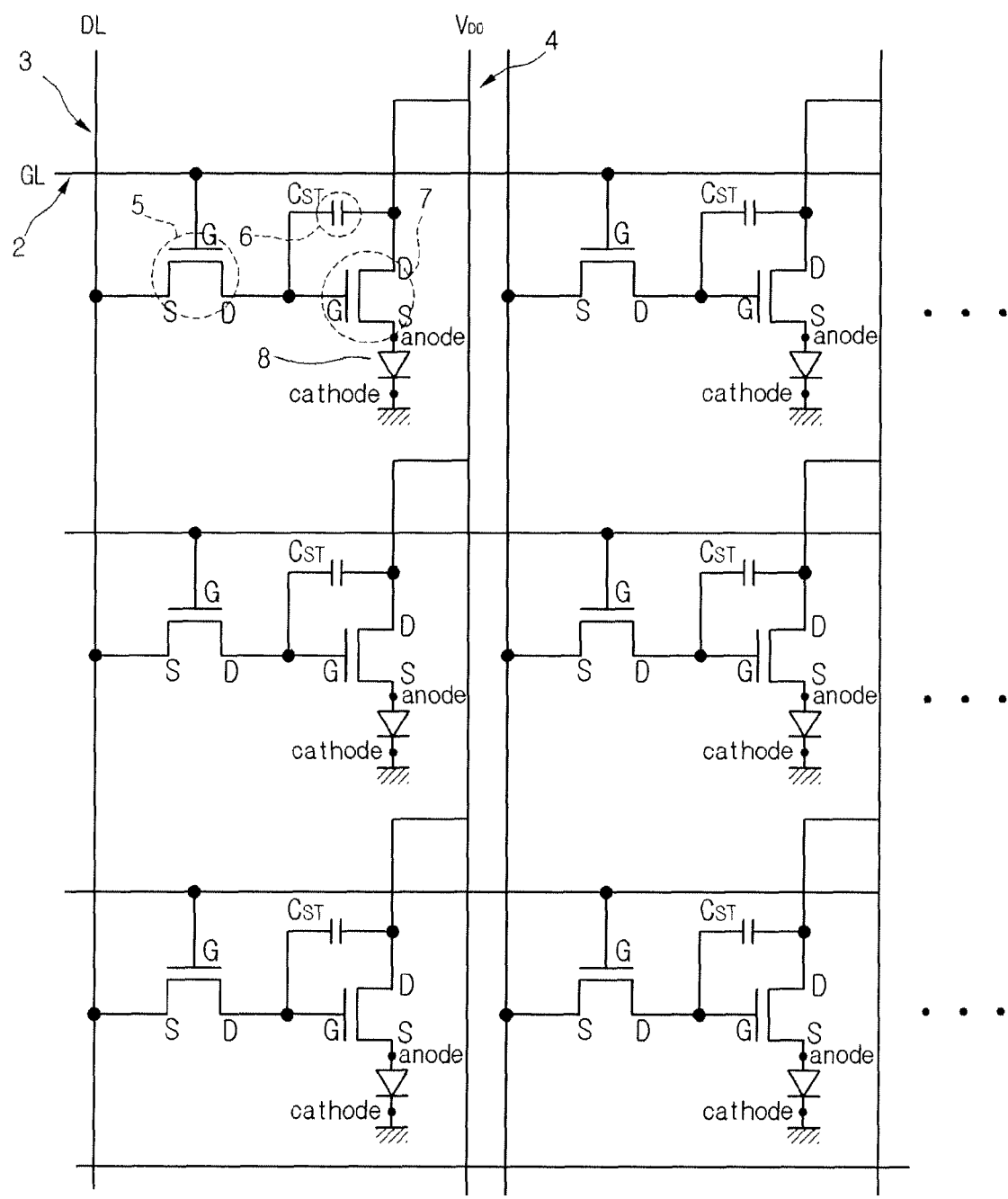
FIG. 1 is a circuit diagram of a basic pixel structure of a related art AMOLED.
Figure 2:
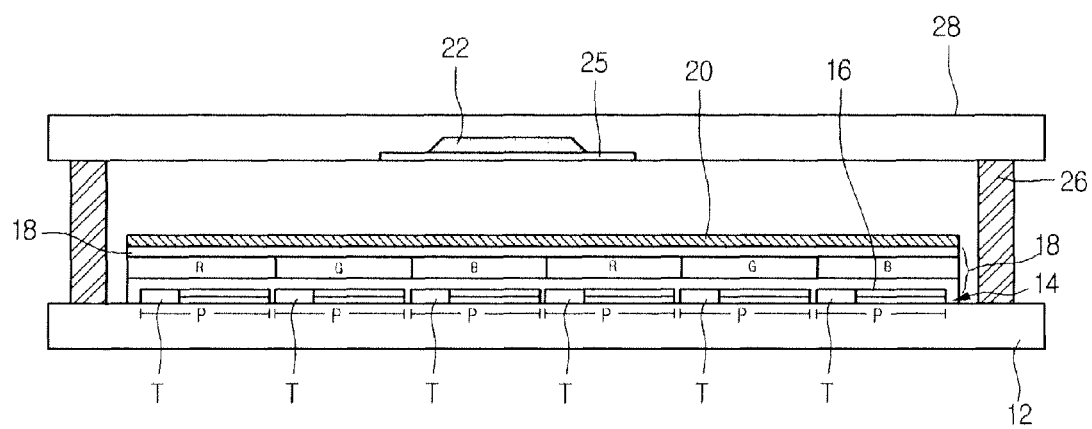
FIG. 2 is a schematic sectional view of a related art bottom emission type AMOLED.
Figure 3:
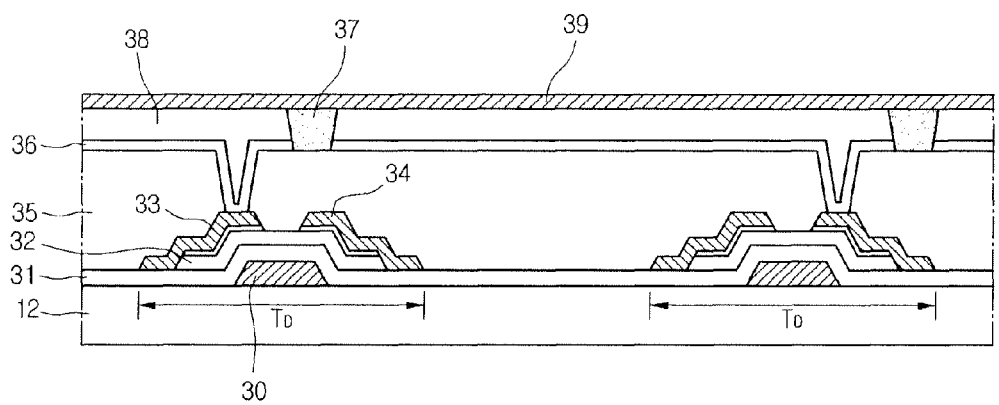
FIG. 3 is a sectional view of a portion including a TFT array part of the AMOLED depicted in FIGS. 1 and 2.

FIG. 5 corresponds to the sectional view of the related art AMOLED illustrated in FIG. 3. Positions of the source and drain electrodes of the drive TFT are changed, and the drain electrode of the drive TFT is connected not to the first electrode (anode) but to the second electrode (cathode) of the organic electro luminescence diode.

According to the present invention, the organic electro luminescence diode is not configured in an inverted EL structure but in a more conventional EL structure.

In case of the conventional EL structure, the organic electro luminescence diode is formed by depositing a first electrode (anode), a hole injection layer (HIL), a hole transporting layer (HTL), an emission layer (EML), an electron transporting layer (ETL), and a second electrode (cathode) in this order.

Meanwhile, the inverted EL structure forms the organic electro luminescence diode in an order opposite to the conventional EL structure. That is, the organic electro luminescence diode is formed by depositing a second electrode (cathode), an electron transporting layer (ETL), an emission layer (EML), a hole transporting layer (HTL), a hole injection layer (HIL), and a first electrode (anode) in this order.

Although the inverted EL structure is proposed for solving an unstable driving problem of the related art AMOLED, an interface of the organic emission layer and the anode are susceptible to damage and a characteristic of the device may be affected.

As described above, the related art AMOLED is configured with the conventional EL structure, in which the first electrode of the organic electro luminescence diode is formed at a lower portion so that it can be connected to the source electrode of the drive TFT. However, the present invention maintains the conventional EL structure but connects the second electrode of the organic electro luminescence diode to the drain electrode of the drive TFT.

The TFT array part of the AMOLED according to the present invention includes a switching element, a drive element and a storage capacitor (not shown) at every pixel defined on the substrate. The switching element or the drive element can be configured with one or more TFTs, depending on the operational characteristics.

The AMOLED using the a-Si TFT is illustrated in FIG. 5. In this case, as described above, the drive TFT illustrated in FIG. 5 is n-type.

According to the related art, the drive TFT is the n-type a-Si TFT and the first electrode of the organic electro luminescence diode is connected to the source electrode of the drive TFT. Accordingly, the related art AMOLED has a problem in that the device is driven unstably. However, the present invention can solve the problem by connecting the second electrode of the organic electro luminescence diode to the drain electrode of the drive TFT while otherwise maintaining the conventional EL structure.

Referring to FIG. 5, the drive TFT $T_D$ includes a gate electrode 510 formed on a substrate 500, a gate insulating layer 520, and source and drain electrodes 540 and 550. The active layer 530 is formed between the source electrode 540 and the drain electrode 550.

Also, the pixel region includes a second electrode 600 of the organic electro luminescence diode, which is connected to the drain electrode 550, a multi-layer or single layer organic emission layer 590 formed below the second electrode 600, and a first electrode 570 for injecting holes into the organic emission layer 590.

The second electrode 600 functions to inject electrons into the organic emission layer 590.

That is, in forming the organic electro luminescence diode, the conventional EL structure is applied such that the first electrode 570, the organic emission layer 590 and the second electrode 600 are sequentially formed. At this point, the second electrode 600 formed on the uppermost portion is connected to the drain electrode 550 of the drive TFT $T_D$.

Further, in case the organic emission layer 590 is formed with multi-layers, the organic emission layer 590 can be formed by depositing a hole injection layer (HIL), a hole transporting layer (HTL), an emission layer (EML), and an electron transporting layer (ETL) on the first electrode 570 in this order.

Here, the pixel regions are arranged in a matrix configuration and are partitioned from each other by barrier ribs 582.

In other words, according to the present invention, the first electrode (the anode of the organic electro luminescence diode) is entirely formed as the common electrode on the substrate 500, on which the drive TFT $T_D$ is formed. In order to expose the drain electrode 550 of the drive TFT $T_D$, a contact hole (not shown) is formed on the first electrode 570 and a passivation layer 560, which are formed on the drain electrode 550.

Further, the barrier rib 582 is formed on a predetermined portion of the first electrode 570 to partition the pixel regions. The organic emission layer 590 including the hole injection layer (HIL), the hole transporting layer (HTL), the emission layer (EML) and the electron transporting layer (ETL) is formed within the pixel region partitioned by the barrier rib 582. Then, the second electrode 600 acting as the pixel electrode is formed on the organic emission layer 590. Accordingly, the second electrode 600 and the drain electrode 550 are connected to each other through the contact hole.

As illustrated, the second electrodes 600 formed at the respective pixel regions are separated from one another by the barrier ribs 582, and the first electrode 570 is formed on the entire substrate except a region where the contact hole is formed, thereby providing a pixel to pixel connection.

A method of fabricating the AMOLED according to the present invention will be described below in detail with reference to FIG. 6.

FIGS. 6A to 6F are sectional views illustrating a method of fabricating the AMOLED according to the present invention. In particular, FIGS. 6A to 6F are sectional views illustrating a fabricating method of the region shown in FIG. 5, that is, the region including the drive TFT of the TFT array part.

Figure 6A:
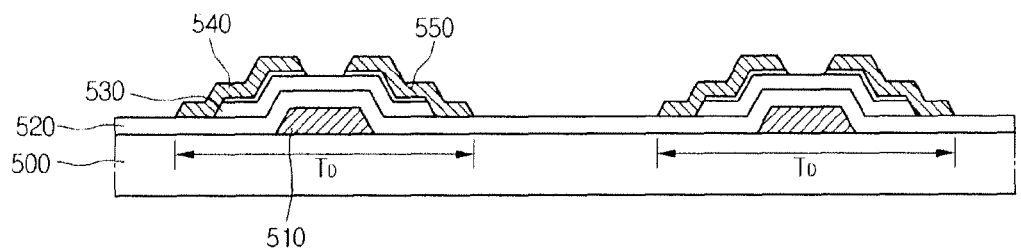
FIGS. 6A through 6F are sectional views illustrating a method of fabricating an AMOLED according to the present invention.

Referring to FIG. 6A, an a-Si TFT is formed on a substrate 500.

That is, the TFT is formed as a switching element or a drive element at every pixel region defined on the substrate 500. In FIG. 6, it is shown as a drive transistor $T_D$ formed at each pixel region.

The a-Si TFT includes a gate electrode 510, a gate insulating layer 520, an active layer 530, and source and drain electrodes 540 and 550, which are deposited in sequence on the substrate 500.

The active layer 530 is formed of a-Si and, in this exemplary case, the TFT is n-type.

The TFT is formed through a plurality of mask processes. Recently, it is usual that the active layer 530 and the source and drain electrodes 540 and 550 are formed through one-time mask process, such that the fabricating process is reduced.

Figure 6B:
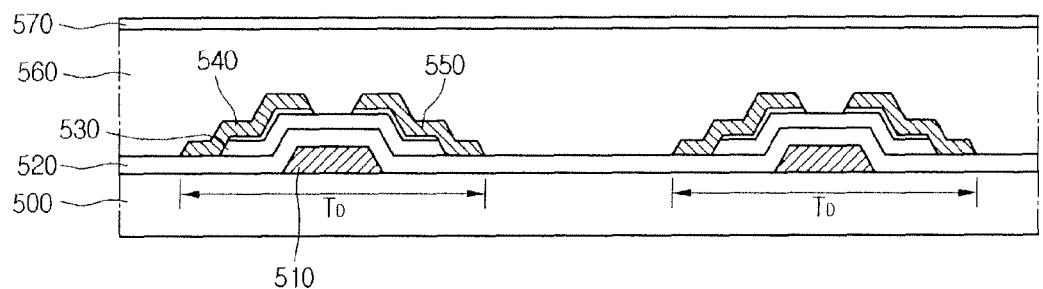

Referring to FIG. 6B, a passivation layer 560 is formed on a resultant structure in which the TFT is formed on the substrate 500. A first electrode (anode) 570, which acts as a common electrode, is formed on the passivation layer 560.

The passivation layer 560 may be formed of silicon nitride layer, silicon oxide layer or BCB, photo acryl, and so on. The first electrode 570 in the exemplary embodiment refers to an anode of the organic electro luminescence diode and may be formed of a transparent material such as indium-tin-oxide (ITO), or a colored metal such as aluminum (Al) and chrome (Cr).

If the a-Si TFT is used as the TFT, its size becomes large. Therefore, the top emission type instead of the bottom emission type is generally employed.

When the first electrode 570 acting as the common electrode is formed of the transparent material such as ITO, it is preferable to form a metal layer (not shown) acting as a reflector on a lower portion of the first electrode 570.

Meanwhile, when the first electrode 570 is formed of the colored metal such as aluminum (Al) or chrome (Cr), the reflector may not be formed.

Figure 6C:
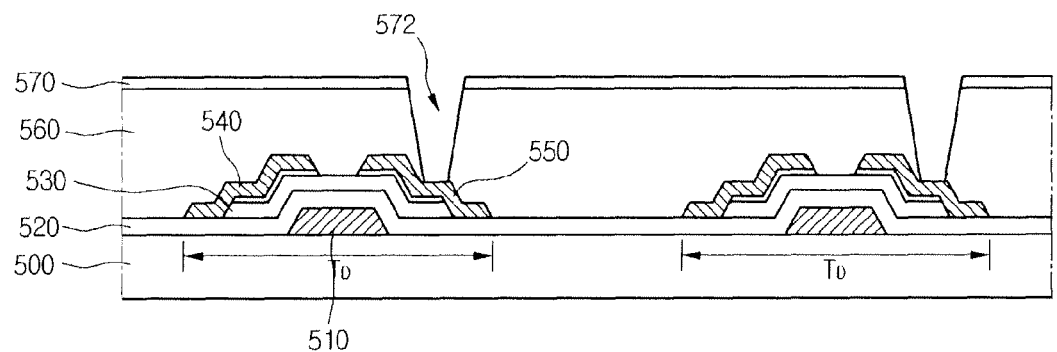

Referring to FIG. 6C, a contact hole 572 exposing the drain electrode 550 of the drive TFT $T_D$ is formed at a portion of the passivation layer 560 and the first electrode 570, which are formed on the drain electrode 550. The contact hole 572 will be used to connect a second electrode to the drain electrode. Also, since the contact hole 572 is formed only at a predetermined portion above the drain electrode 550, the first electrode 570 still remains on an entire area of the pixel region. That is, the first electrode 570 is formed on an entire area of the pixel region except for the region where the contact hole 572 is formed, thus providing a pixel to pixel connection.

Figure 6D:
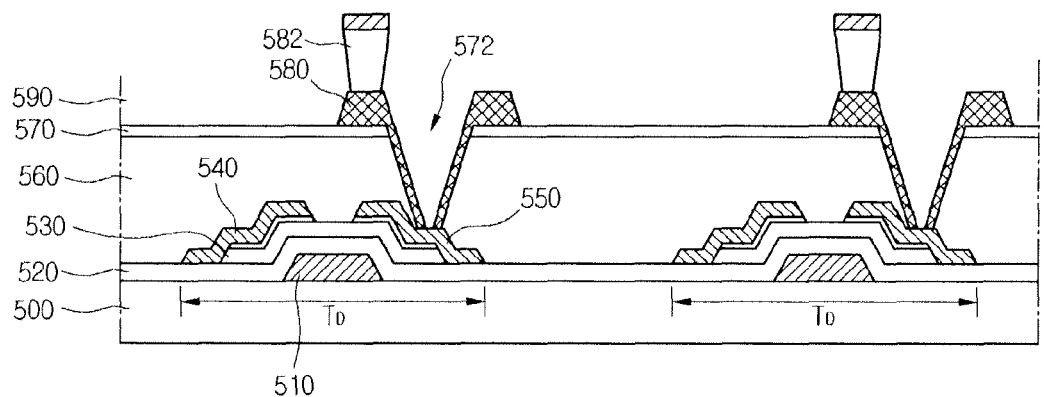

Referring to FIG. 6D, a buffer layer 580 and a barrier rib 582 are formed on a predetermined portion of an upper surface of the first electrode 570. The buffer layer 580 defines a region where an organic emission layer is formed, and the barrier rib 582 partitions the respective pixel regions.

That is, the buffer layer is provided at a periphery of a region where the organic emission layer is formed within the pixel region, so that the organic emission layer cannot be formed at a region except for the buffer layer 580. The barrier rib is formed on a predetermined portion of an upper surface of the buffer layer 580 and partitions the pixel regions from one another.

Figure 6E:
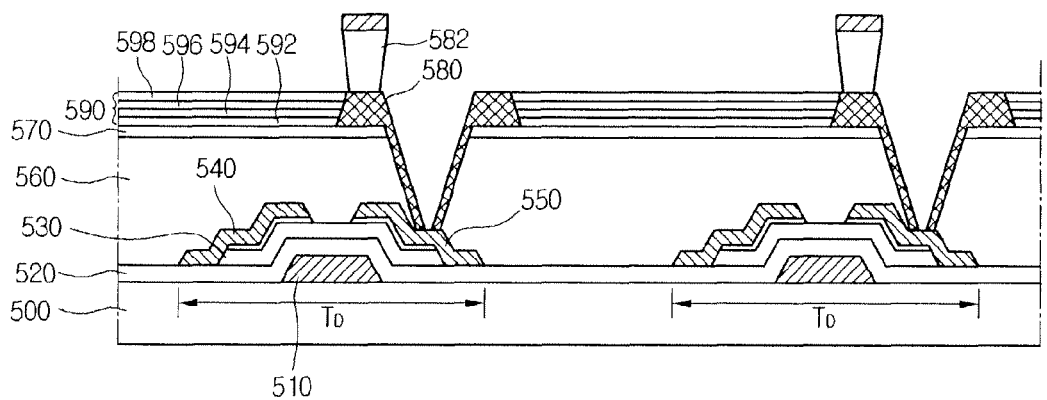

Referring to FIG. 6E, the organic emission layer 590 is formed within the region defined by the buffer layer 580.

The organic emission layer 590 may be made in a multi-layer or single layer structure, and the multi-layer structure is usual. In case of the multi-layer structure, the organic emission layer 590 includes a hole injection layer (HIL) 592, a hole transporting layer (HTL) 594, an emission layer (EML) 596, and an electron transporting layer (ETL) 598, which are deposited on the first electrode 570 in this order.

Since the organic emission layer 590 is formed within the region defined by the buffer layer 580, it is not formed at the region where the contact hole 572 is formed.

Figure 6F:
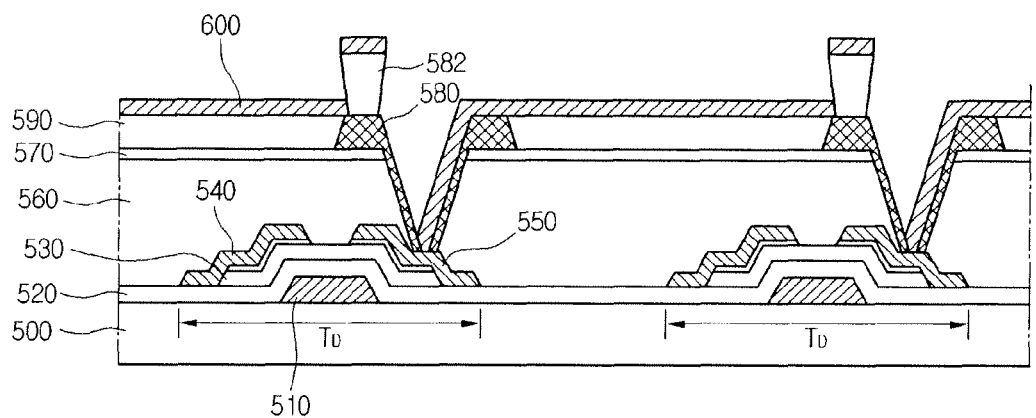

Referring to FIG. 6F, a second electrode 600 acting as a pixel electrode is formed such that the second electrode 600 and the drain electrode 550 are connected to each other through the contact hole 572. As shown, the second electrodes 600 are separated at each pixel region by the barrier rib 582.

Since the top emission type can be applied in the AMOLED of the present invention, the second electrode 600 may be formed of a metal capable of transmitting light, or at a thickness less than 100 Å such that light can transmit the second electrode.

Another embodiment of the present invention for forming an AMOLED is illustrated in FIGS. 7A through 7F.

Figure 7A:
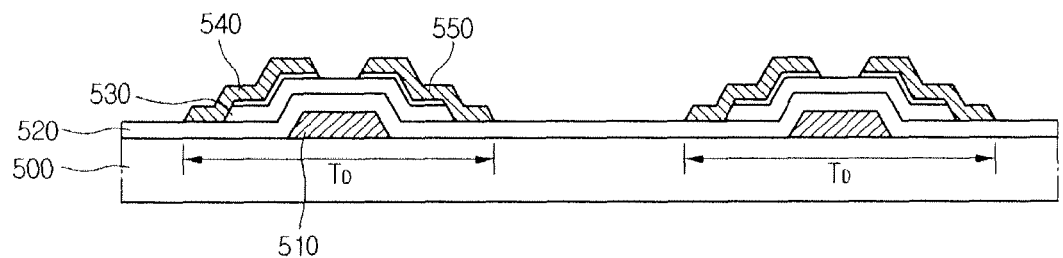
FIGS. 7A through 7F are sectional views illustrating another method of fabricating an AMOLED according to the present invention.

Referring to FIG. 7A, an a-Si TFT is formed on a substrate 500. That is, a TFT is formed as a switching element or a drive element at every pixel region defined on the substrate 500. As an example, a drive transistor $T_D$ is illustrated. The a-Si TFT includes a gate electrode 510, a gate insulating layer 520, an active layer 530, and source and drain electrodes 540 and 550, which are deposited in sequence on the substrate 500.

The active layer 530 is formed of a-Si and, in this exemplary case, the TFT is n-type. The TFT is formed through a plurality of mask processes. Recently, it is usual that the active layer 530 and the source and drain electrodes 540 and 550 are formed through one-time mask process, such that the fabricating process is reduced.

Figure 7B:
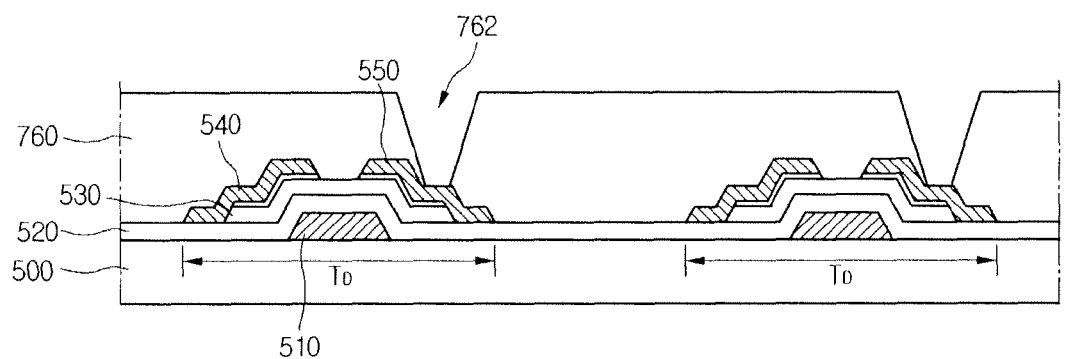

Referring to FIG. 7B, a passivation layer 760 is formed on a resultant structure in which the TFT is formed on the substrate 500. The passivation layer 760 is patterned to form a contact hole 762. The passivation layer 760 may be formed of silicon nitride layer, silicon oxide layer or BCB, photo acryl, and so on.

Figure 7C:
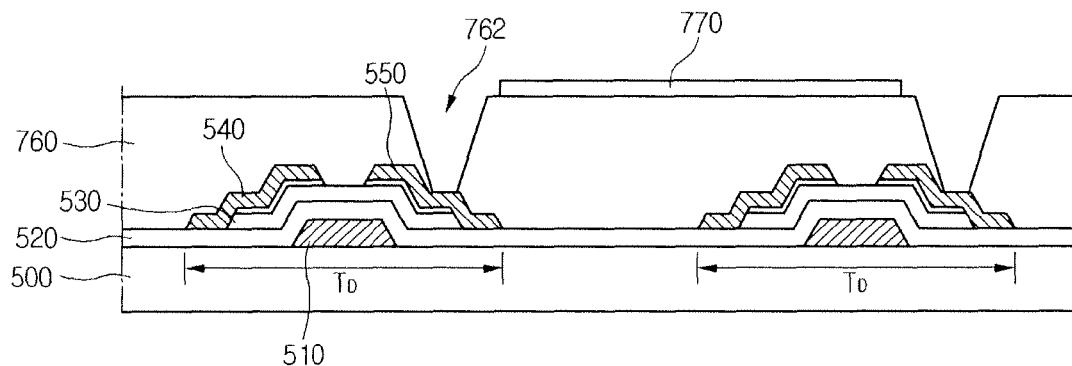

After that, as illustrated in FIG. 7C, a first electrode (anode) 770 is formed on the passivation layer 760 and patterned to have a contact hole corresponding to the contact hole 762 through the passivation layer. The first electrode 570 in the exemplary embodiment refers to an anode of the organic electro luminescence diode and may be formed of a transparent material such as indium-tin-oxide (ITO), or a colored metal such as aluminum (Al) and chrome (Cr). A portion of the upper surface of the drain electrode 550 is exposed through the contact hole 762.

As discussed above with respect to the embodiment of FIG. 6, if the a-Si TFT is used as the TFT, its size becomes large. Therefore, the top emission type instead of the bottom emission type is generally employed. When the first electrode 570 acting as the common electrode is formed of the transparent material such as ITO, it is preferable to form a metal layer (not shown) acting as a reflector on a lower portion of the first electrode 570. Meanwhile, when the first electrode 570 is formed of the colored metal such as aluminum (Al) or chrome (Cr), the reflector may not be formed.

Figure 7D:
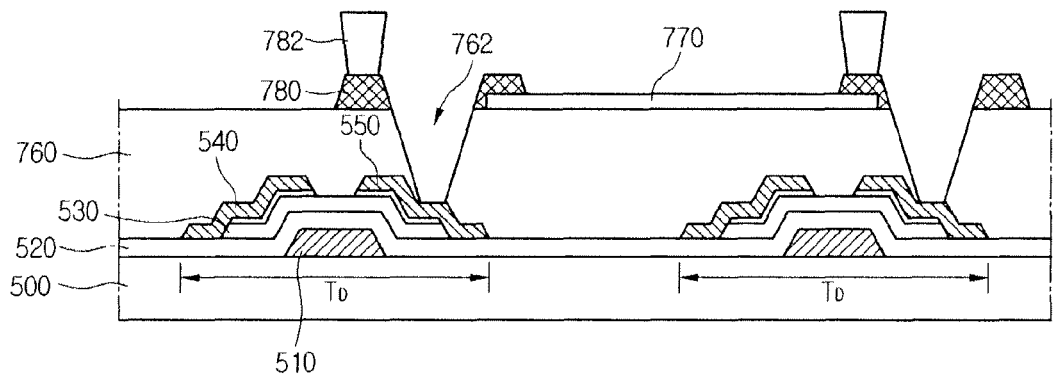

Referring to FIG. 7D, a buffer layer 780 and a barrier rib 782 are formed on a predetermined portion of an upper surface of the first electrode 570. The buffer layer 780 surrounds a region where an organic emission layer is formed, and the barrier rib 782 partitions the respective pixel regions.

Figure 7E:
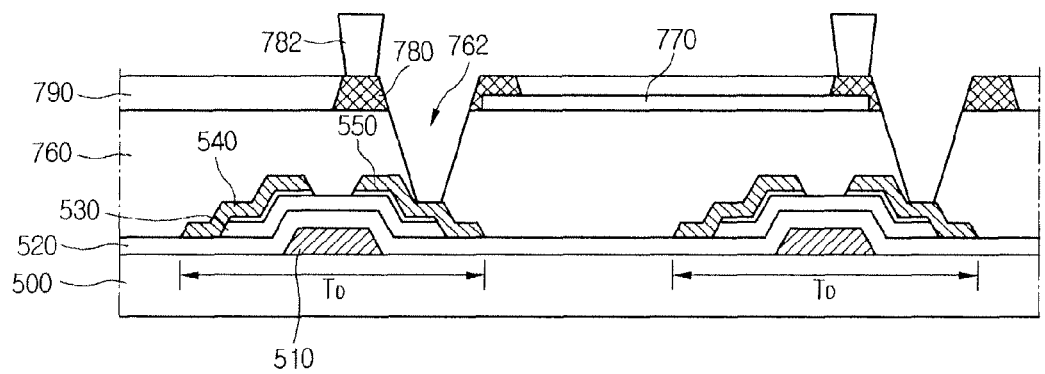

Referring to FIG. 7E, the organic emission layer 790 is formed within the region defined by the buffer layer 780.

The organic emission layer 790 may be made in a multi-layer or single layer structure, and the multi-layer structure is usual. In case of the multi-layer structure, the organic emission layer 890 includes a hole injection layer (HIL), a hole transporting layer (HTL), an emission layer (EML), and an electron transporting layer (ETL), which are deposited on the first electrode 770 in this order.

Since the organic emission layer 790 is formed within the region defined by the buffer layer 780, it is not formed at the region where the contact hole 762 is formed.

Figure 7F:
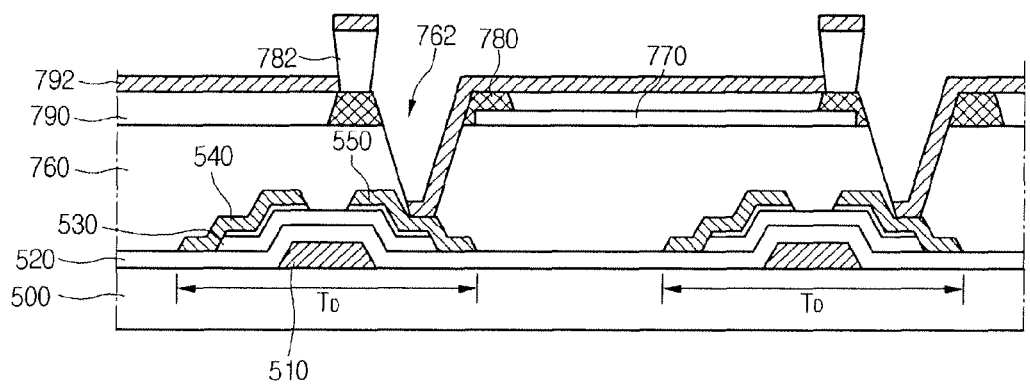

Referring to FIG. 7F, a second electrode 792 acting as a pixel electrode is formed such that the second electrode 792 and the drain electrode 550 are connected to each other through the contact hole 762. As illustrated, the second electrodes 792 are separated at each pixel region by the barrier rib 782.

Another embodiment of the present invention for forming an AMOLED is illustrated in FIGS. 8A through 8F.

Figure 8A:
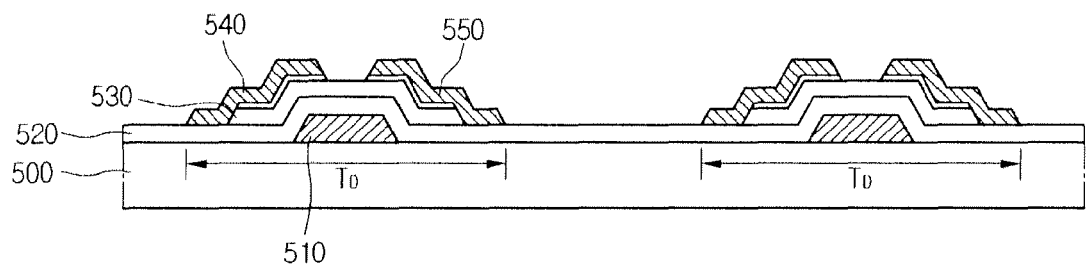
FIGS. 8A through 8F are sectional vies illustrating another method of fabricating an AMOLED according to the present invention.

Referring to FIG. 8A, an a-Si TFT is formed on a substrate 500. That is, a TFT is formed as a switching element or a drive element at every pixel region defined on the substrate 500. As an example, a drive transistor $T_D$ is illustrated. The a-Si TFT includes a gate electrode 510, a gate insulating layer 520, an active layer 530, and source and drain electrodes 540 and 550, which are deposited in sequence on the substrate 500.

The active layer 530 is formed of a-Si and, in this exemplary case, the TFT is n-type. The TFT is formed through a plurality of mask processes. Recently, it is usual that the active layer 530 and the source and drain electrodes 540 and 550 are formed through one-time mask process, such that the fabricating process is reduced.

Figure 8B:
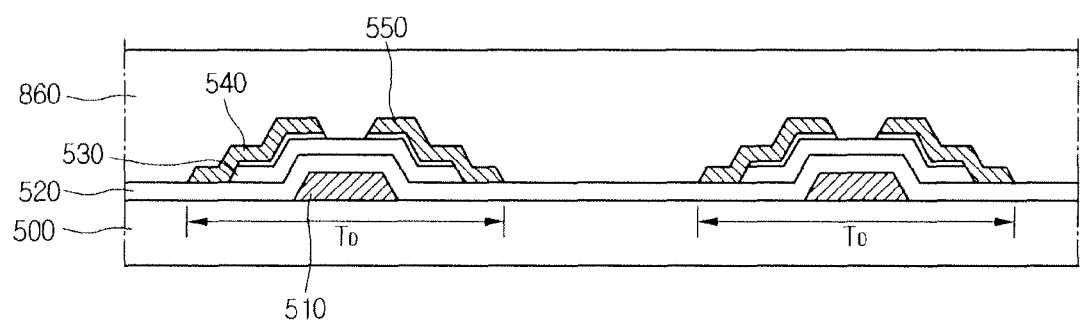
Figure 8C:
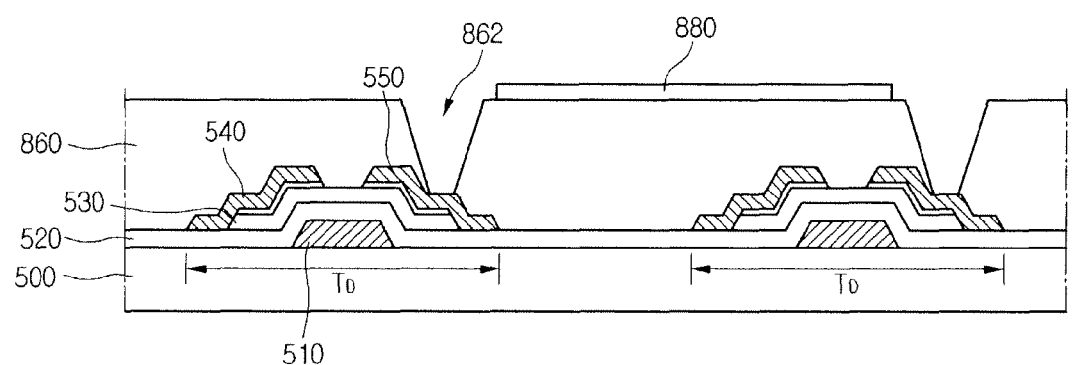

Referring to FIG. 8B, a passivation layer 860 is formed on a resultant structure in which the TFT is formed on the substrate 500. The passivation layer 860 may be formed of silicon nitride layer, silicon oxide layer or BCB, photo acryl, and so on. After that, a first electrode (anode) 880 is formed on the passivation layer 860. Thereafter, the passivation layer 860 and the first electrode 880 are patterned to form a contact hole 862 exposing a portion of the drain electrode 550. The first electrode 570 in the exemplary embodiment refers to an anode of the organic electro luminescence diode and may be formed of a transparent material such as indium-tin-oxide (ITO), or a colored metal such as aluminum (Al) and chrome (Cr). A portion of the upper surface of the drain electrode 550 is exposed through the contact hole 862.

As discussed above with respect to the embodiment of FIG. 6, if the a-Si TFT is used as the TFT, its size becomes large. Therefore, the top emission type instead of the bottom emission type is generally employed. When the first electrode 570 acting as the common electrode is formed of the transparent material such as ITO, it is preferable to form a metal layer (not shown) acting as a reflector on a lower portion of the first electrode 570. Meanwhile, when the first electrode 570 is formed of the colored metal such as aluminum (Al) or chrome (Cr), the reflector may not be formed.

Figure 8D:
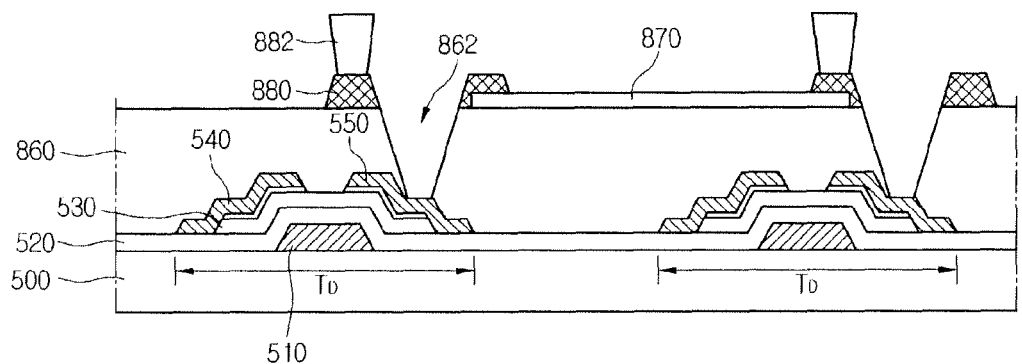

Referring to FIG. 8D, a buffer layer 870 and a barrier rib 882 are formed on a predetermined portion of an upper surface of the first electrode 570. The buffer layer 880 surrounds a region where an organic emission layer is formed, and the barrier rib 882 partitions the respective pixel regions.

Figure 8E:
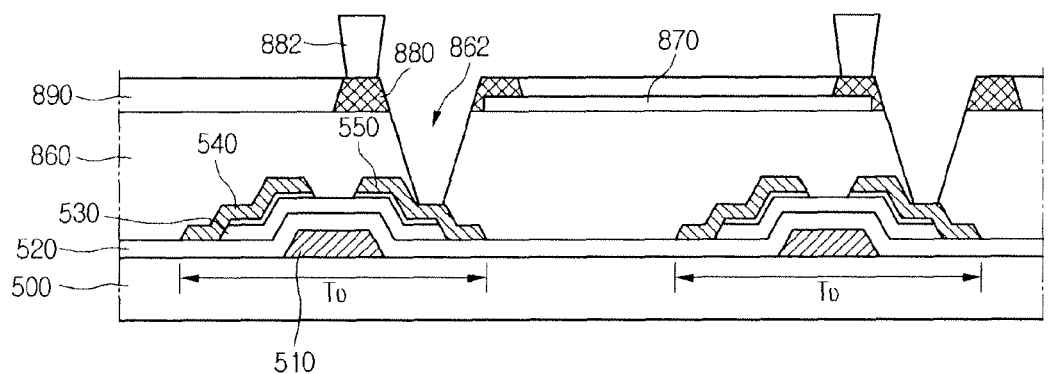

Referring to FIG. 8E, the organic emission layer 890 is formed within the region defined by the buffer layer 880.

The organic emission layer 890 may be made in a multi-layer or single layer structure, and the multi-layer structure is usual. In case of the multi-layer structure, the organic emission layer 890 includes a hole injection layer (HIL), a hole transporting layer (HTL), an emission layer (EML), and an electron transporting layer (ETL), which are deposited on the first electrode 870 in this order.

Since the organic emission layer 890 is formed within the region defined by the buffer layer 880, it is not formed at the region where the contact hole 862 is formed.

Figure 8F:
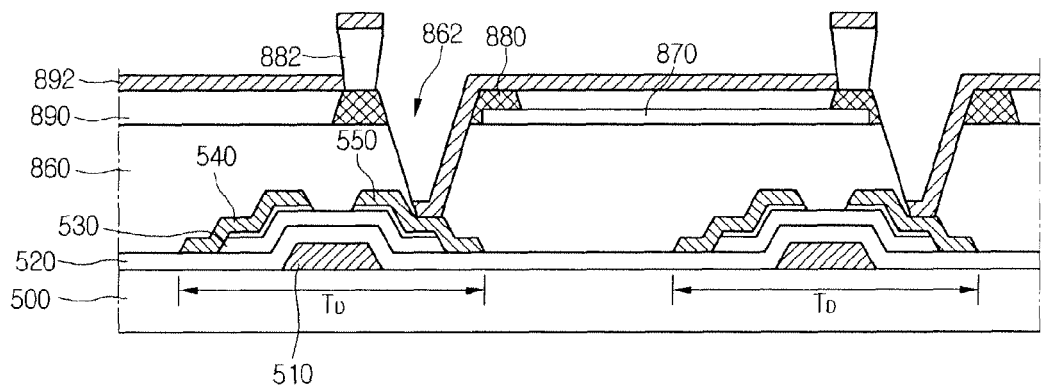

Referring to FIG. 8F, a second electrode 892 acting as a pixel electrode is formed such that the second electrode 892 and the drain electrode 550 are connected to each other through the contact hole 862. As illustrated, the second electrodes 892 are separated at each pixel region by the barrier rib 882.

According to the present invention, the drain electrode of the drive TFT is connected to the second electrode of the organic electro luminescence diode. Also, the present invention maintains the conventional EL structure like the related art, such that the organic electro luminescence device can be driven easily and stably.

Further, according to the AMOLED of the present invention, the TFTs for the drive elements of the pixels are made of amorphous TFTs and the second electrode (cathode) of the organic electro luminescence diode is connected to the drain electrode of the drive TFT, such that the organic electro luminescence device can be driven stably.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating an organic electro luminescence device, the method comprising:
    forming a thin film transistor on a substrate;
    forming a passivation layer directly over the thin film transistor;
    forming an opaque metal layer as a reflector over the passivation layer;
    forming a first electrode layer over the opaque metal layer;
    forming a contact hole through the passivation layer and the first electrode layer exposing an upper surface of a drain electrode of the thin film transistor at a predetermined portion of the first electrode and the passivation layer;
    forming a buffer layer on a predetermined portion of an upper surface of the first electrode;
    forming a barrier rib directly adjacent to the contact hole over the buffer layer;
    forming an organic emission layer within a region defined by the buffer layer; and
    forming a second electrode on the organic emission layer such that the second electrode is electrically connected with the drain electrode through the contact hole.

2. The method of claim 1, wherein the thin film transistor is formed by sequentially depositing a gate electrode, a gate insulating layer, an active layer, an ohmic contact layer, a source electrode and a drain electrode.

3. The method of claim 2, wherein the active layer is formed of a-Si and the thin film transistor is an n-type.

4. The method of claim 1, wherein the first electrode is formed of ITO (indium-tin-oxide) that is a transparent conductive material.

5. The method of claim 1, wherein the first electrode is formed of an opaque metal selected from the group consisting of Al and Cr.

6. The method of claim 1, wherein the first electrode is formed on an area except for a region where the contact hole is formed.

7. The method of claim 1, wherein the buffer layer is provided at a periphery of a pixel region where the organic emission layer is formed.

8. The method of claim 1, when the organic emission layer is formed by sequentially depositing an HIL, an HTL, an EML and an ETL on the first electrode.

9. The method of claim 7, wherein the second electrodes are separated at each pixel region by the barrier rib.

10. The method of claim 1, wherein the second electrode is formed of a transparent metal.

11. The method of claim 1, wherein the second electrode has a thickness less than about 100 Å such that light can transmit the second electrode.

12. The method of claim 1, wherein the first electrode is an anode and the second electrode is a cathode.

13. A method of fabricating an organic electro luminescence device, the method comprising:
    forming a thin film transistor on a substrate;
    forming a passivation layer directly over the thin film transistor;
    forming an opaque metal layer as a reflector over the passivation layer;
    patterning the passivation layer to form a contact hole;
    forming a first electrode layer over the opaque metal layer;
    patterning the first electrode layer to form a contact hole corresponding to the contact hole through the passivation layer and exposing an upper surface of a drain electrode of the thin film transistor at a predetermined portion of the first electrode and the passivation layer;
    forming a buffer layer on a predetermined portion of an upper surface of the first electrode;
    forming a barrier rib directly adjacent to the contact hole on the buffer layer;
    forming an organic emission layer within a region defined by the buffer layer; and
    forming a second electrode on the organic emission layer such that the second electrode is electrically connected with the drain electrode through the contact hole.

14. The method of claim 13, wherein the thin film transistor is formed by sequentially depositing a gate electrode, a gate insulating layer, an active layer, an ohmic contact layer, a source electrode and a drain electrode.

15. The method of claim 14, wherein the active layer is formed of a-Si and the thin film transistor is an n-type.

16. The method of claim 13, wherein the first electrode is formed of ITO (indium-tin-oxide) that is a transparent conductive material.

17. The method of claim 13, wherein the first electrode is formed of an opaque metal selected from the group consisting of Al and Cr.

18. The method of claim 13, wherein the first electrode is formed on an area except for a region where the contact hole is formed.

19. The method of claim 13, wherein the buffer layer is provided at a periphery of a pixel region where the organic emission layer is formed.

20. The method of claim 13, when the organic emission layer is formed by sequentially depositing an HIL, an HTL, an EML and an ETL on the first electrode.

21. The method of claim 13, wherein the second electrodes are separated at each pixel region by the barrier rib.

22. The method of claim 13, wherein the second electrode is formed of a transparent metal.

23. The method of claim 13, wherein the second electrode has a thickness less than about 100 Å such that light can transmit the second electrode.

24. The method of claim 13, wherein the first electrode is an anode and the second electrode is a cathode.

25. A method of fabricating an organic electro luminescence device, the method comprising:
    forming a thin film transistor on a substrate;
    forming a passivation layer directly over the thin film transistor;
    forming an opaque metal layer as a reflector over the passivation layer;
    forming a first electrode layer over the opaque metal layer;
    patterning the first electrode layer to form a contact hole;
    patterning the passivation layer to form a contact hole corresponding to the contact hole through the first electrode layer and exposing an upper surface of a drain electrode of the thin film transistor at a predetermined portion of the first electrode and the passivation layer;
    forming a buffer layer on a predetermined portion of an upper surface of the first electrode;
    forming an organic emission layer within a region defined by the buffer layer;
    forming a barrier rib directly adjacent to the contact hole on the buffer layer; and
    forming a second electrode on the organic emission layer such that the second electrode is electrically connected with the drain electrode through the contact hole.

26. The method of claim 25, wherein the thin film transistor is formed by sequentially depositing a gate electrode, a gate insulating layer, an active layer, an ohmic contact layer, a source electrode and a drain electrode.

27. The method of claim 26, wherein the active layer is formed of a-Si and the thin film transistor is an n-type.

28. The method of claim 25, wherein the first electrode is formed of ITO (indium-tin-oxide) that is a transparent conductive material.

29. The method of claim 25, wherein the first electrode is formed of an opaque metal selected from the group consisting of Al and Cr.

30. The method of claim 25, wherein the first electrode is formed on an area except for a region where the contact hole is formed.

31. The method of claim 25, wherein the buffer layer is provided at a periphery of a pixel region where the organic emission layer is formed.

32. The method of claim 25, when the organic emission layer is formed by sequentially depositing an HIL, an HTL, an EML and an ETL on the first electrode.

33. The method of claim 31, wherein the second electrodes are separated at each pixel region by the barrier rib.

34. The method of claim 25, wherein the second electrode is formed of a transparent metal.

35. The method of claim 25, wherein the second electrode has a thickness less than about 100 Å such that light can transmit the second electrode.

36. The method of claim 25, wherein the first electrode is an anode and the second electrode is a cathode.

* * * * *